United States Patent
Bondavalli et al.

(10) Patent No.: US 10,410,110 B2
(45) Date of Patent: Sep. 10, 2019

(54) NEUROMIMETIC CIRCUIT AND METHOD OF FABRICATION

(71) Applicants: THALES, Courbevoie (FR); Centre national de la recherche scientifique, Paris (FR)

(72) Inventors: Paolo Bondavalli, Palaiseau (FR); Julie Grollier, Paris (FR); Frederic Nguyen Van Dau, Palaiseau (FR)

(73) Assignees: THALES, Courbevoie (FR); CENTRE NATIONAL DE LA RECHERCHE SCIENTIFIQUE (C.N.R.S.), Paris (FR)

( * ) Notice: Subject to any disclaimer, the term of this patent is extended or adjusted under 35 U.S.C. 154(b) by 278 days.

(21) Appl. No.: 15/026,923

(22) PCT Filed: Oct. 2, 2014

(86) PCT No.: PCT/EP2014/071184
§ 371 (c)(1),
(2) Date: Apr. 1, 2016

(87) PCT Pub. No.: WO2015/049347
PCT Pub. Date: Apr. 9, 2015

(65) Prior Publication Data
US 2016/0253588 A1    Sep. 1, 2016

(30) Foreign Application Priority Data
Oct. 2, 2013    (FR) .................................... 13 02294

(51) Int. Cl.
*G06N 3/04*    (2006.01)
*G06N 3/06*    (2006.01)
(Continued)

(52) U.S. Cl.
CPC ................ *G06N 3/04* (2013.01); *B05D 1/02* (2013.01); *G06N 3/06* (2013.01); *G06N 3/08* (2013.01); *H01L 45/04* (2013.01)

(58) Field of Classification Search
CPC ... G06N 3/04; G06N 3/06; G06N 3/08; G06F 15/18; B05D 1/02; H01L 45/04
(Continued)

(56) References Cited

U.S. PATENT DOCUMENTS

| 2002/0071168 A1* | 6/2002 | Simic-Glavaski ..... B82Y 10/00 359/253 |
| 2005/0256816 A1* | 11/2005 | Nugent .................. B82Y 10/00 706/27 |

(Continued)

FOREIGN PATENT DOCUMENTS

| EP | 2629459 A2 | 8/2013 |
| FR | 2921221 A1 | 3/2009 |

OTHER PUBLICATIONS

Hu et al., "Safety Critical Applications and Hard Real-Time Profile for Java: A Case Study in Avionics", JTRES, Oct. 11, 2006, pp. 125-134.

(Continued)

*Primary Examiner* — Tan T. Nguyen
(74) *Attorney, Agent, or Firm* — Thompson Coburn LLP; Thaddeus J. Blenke

(57) ABSTRACT

This circuit includes a random network, said random network including: nodes, each node being formed with a pad forming an electric contact borne on a face of a substrate; and links between nodes, each link being formed with at least one unidimensional nanometric object with variable and non-volatile resistance having a configured resistance (Continued)

subsequently to the application of a suitable stimulus between at least one pair of pads connected through said link.

2 Claims, 2 Drawing Sheets

(51) Int. Cl.
  *B05D 1/02* (2006.01)
  *G06N 3/08* (2006.01)
  *H01L 45/00* (2006.01)

(58) Field of Classification Search
  USPC .................................................. 706/26, 27
  See application file for complete search history.

(56) References Cited

U.S. PATENT DOCUMENTS

| | | | |
|---|---|---|---|
| 2010/0083277 A1 | 4/2010 | Malladi et al. | |
| 2011/0223480 A1* | 9/2011 | Wee | B82Y 30/00 |
| | | | 429/218.1 |
| 2012/0297492 A1 | 11/2012 | Court | |
| 2014/0214738 A1* | 7/2014 | Pickett | G11C 11/54 |
| | | | 706/27 |

OTHER PUBLICATIONS

International Search Report for FR 1302143 dated Jun. 5, 2014.
Tejera et al., "RMI-HRT: Remote Method Invocation—Hard Real Time", JTRES, Sep. 26, 2007, pp. 113-120.

* cited by examiner

NEUROMIMETIC CIRCUIT AND METHOD OF FABRICATION

CROSS-REFERENCE TO RELATED APPLICATIONS

This application is a U.S. National Phase application of PCT/EP2014/071184, filed on Oct. 2, 2014, claiming the benefit of FR Application No. 13 02294, filed Oct. 2, 2013, both of which are incorporated herein by reference in their entireties.

FIELD OF INVENTION

The present invention relates to neuromimetic networks and methods for making such networks.

BACKGROUND OF THE INVENTION

During the last 50 years, purely digital computer science of the Von Neumann type have made considerable progress. However, even the most powerful computers provided with the most developed algorithms do not manage to rapidly process problems which are apparently simple, such as the interpretation of an image, which is however achieved in a fraction of a second by the human brain.

The latter, actually operates in a massively parallel and analog way, unlike present computers. The brain typically consists of $10^{11}$ neurones interconnected together. A neurone is connected to another neurone through a synapse. Each neurone is connected to on average 10,000 other neurones. This very high density of interconnections is essential for ensuring a massively parallel processing of information and a self-learning function.

Many studies deal with the possibility of producing neuromimetic circuits, i.e. mimicking the operation of the human brain, in order to go beyond conventional architectures in order to allow cognitive processing of information.

These studies have been re-initiated since 2008 following the arrival of components called memristors. This is a component having an electric resistance which may be modified by applying a suitable stimulus and having the capability of retaining the value of the thereby modified resistance. A memristor is therefore a component having a changeable property in an analog way and having the capability of storing in memory this modification (non-volatile nature).

This change in resistance may be induced by a Redox reaction, a phase transition, a change in the properties of an organic layer, by a purely electronic effect (eg: spin, ferroelectric polarization, etc.).

From among memristors unidimensional nanometric objects are known such as for example nanowires and nanotubes with a phase transition. In particular, many studies have been developed in the field of the growth of nanowires based on GeSbTe, GeTe and InSe.

However, since the discovery of memristors, a limited number of studies have dealt with the architecture of circuits. These studies contemplate a «top-down» approach, according to which a circuit is designed, and then produced by micro- or nano-electronics methods, such as lithographic methods. For example this means making a network of conductive wires, each wire being connected to input and output terminals. Two networks are then superposed at right angles and the wires of a network are interconnected to wires of the other network through a memristor.

The thereby obtained circuits are complicated. However, the interconnection density remains limited by the spatial resolution of the methods used. The fabrication methods are difficult to apply. The achieved circuits are therefore expensive.

SUMMARY OF THE INVENTION

The object of the invention is therefore to overcome these problems, by notably proposing a fabrication method particularly easy to apply, giving the probability of obtaining at a low cost neuromimetic networks.

For this purpose, the object of the invention is a neuromimetic circuit, characterized in that it includes a random network, said random network including:
  nodes, each node being formed with a pad forming an electric contact borne on a face of a substrate; and,
  links between nodes, each link being formed with at least one unidimensional nanometric object with variable and non-volatile resistance having a resistance configured following the application of a suitable stimulus between at least one pair of pads connected by said link.

According to particular embodiments of the invention, the circuit includes one or several of the following features, taken individually or according to all the technically possible combinations:
  each unidimensional nanometric object with variable and non-volatile resistance is a nanowire or a nanotube;
  each unidimensional nanometric object with variable and non-volatile resistance is with a phase transition.

The object of the invention is also a method for making a neuromimetic circuit, the method comprising:
  providing a substrate, one face of which bears a plurality of pads forming electric contacts;
  preparing a solution including unidimensional nanometric objects with variable and non-volatile resistance;
  spraying onto said face of the substrate said solution so as to obtain a random network, said random network including nodes formed by pads and links respectively formed by at least one unidimensional nanometric object; and,
  configuring the random network by applying a suitable stimulus between at least one pair of pads of the random network connected through a link, in order to adapt the resistance of said at least one unidimensional nanometric object constitutive of said link, so as to obtain a neuromimetic network.

According to particular embodiments, the method includes one or several of the following feature, taken individually or according to all the technically possible combinations:
  preparing a solution including unidimensional nanometric objects with variable and non-volatile resistance comprises determining a length distribution of said objects and a number distribution of said objects per unit volume;
  determining a length distribution and a number distribution per unit volume is carried out according to a distribution of distances separating the pads on the substrate.
  spraying is carried out under constraints so as to orient the formation of the links between the pads.

The object of the invention is also a solution including unidimensional nanometric objects with variable and non-volatile resistance able to be used for applying a method for making a neuromimetic circuit according to the method as defined above.

BRIEF DESCRIPTION OF THE DRAWINGS

The invention and its advantages will be better understood upon reading the description which follows, only given as an example, and made with reference to the appended drawings wherein.

DETAILED DESCRIPTION OF PREFERRED EMBODIMENTS

A neuromimetic circuit is a network, the structure of which mimics that of the cortex: a neurone includes a cell body from which leave a dendrite, forming an input for the signals, and a plurality of axones, each forming an output for the signals.

The dendrite and the axones of a neurone are respectively interconnected with an axone and dendrites of other neurones via synapses.

A synapse allows transmission of nerve impulse between an upstream neurone and a downstream neurone.

The efficiency of the transmission may be modified in an analog and non-volatile manner.

The method for making a neuromimetic circuit shown here gives the possibility of producing a network including nodes, the function of which is close to that of a neurone, and of links between two nodes, the function of which is close to that of a synapse between two neurones.

Figure 1:
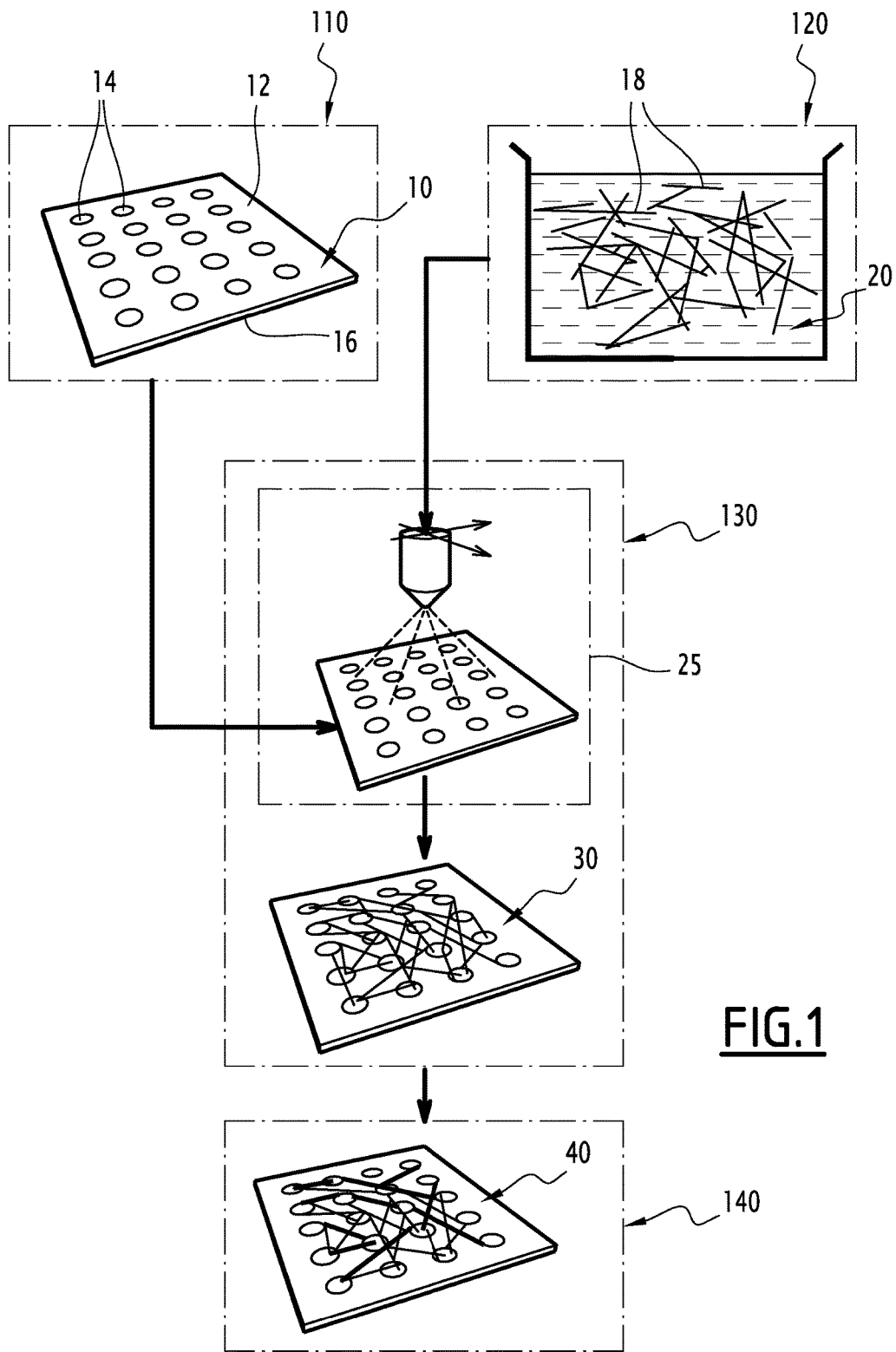
FIG. 1 is a representation as blocks of an embodiment of a method for making a neuromimetic circuit; and, FIG. 2 is a representation of the random neuromimetic circuit obtained at the output of the intermediate spraying step of the method of FIG. 1.

The different steps of the method for making a neuromimetic circuit are illustrated in FIG. 1.

The method includes a step 110 consisting of providing a substrate 10.

The substrate 10 is for example with a rectangular shape and has a small thickness relatively to its length and to its width. The substrate 10 is for example in silicon.

A so called upper face 12 of the substrate 10 bears a plurality of pads 14 forming electric contacts.

Each pad 14 is for example a CMOS transistor etched on the upper face 12 of the substrate.

Advantageously, each pad 14 is electrically connected through the thickness of the substrate 10, to an electric connection terminal located on a so called lower face 16 of the substrate 10.

Alternatively, a pad 14 forms the end of an electric connection terminal connected to a CMOS transistor etched on the lower face 16 of the substrate.

The pads 14 are positioned according to a pattern. For example, they form a grid pattern, the pads being positioned at the intersection of the lines and columns of the grid. The pitch p between two successive pads along a line or a column of the grid is a characteristic distance between neighbouring pads.

The method includes a step 120 consisting of preparing a solution including unidimensional nanometric objects with variable and non-volatile resistance 18.

Such objects are with a variable and non-volatile resistance since their electric resistance may be modified in an analog manner by applying a stimulus and they have the capability of retaining the value of the thereby modified electric resistance.

Such objects are unidimensional since they have a dimension of at least about ten nanometers along their main direction, and of a few nanometers only along the two directions perpendicular to the main direction.

Such unidimensional nanometric objects may be hollow, they are then called nanotubes, or solid, they are then designated as nanowires.

As examples of such objects, one finds nanowires/nanotubes with a phase transition, the electric resistance of which may be modified by applying a configuration voltage, the value of which is comprised in a suitable range.

The objects 18 are thus preferably nanowires based on InSe or GeSbTe.

The objects 18 put into solution are selected so that the length distribution of the objects 18 in solution is adapted to the pitch p between neighbouring pads. For example, the length distribution has an average width $l_{avg}$ equal to $\sqrt{2}$ p.

The concentration of the number of objects 18 per unit volume of the prepared solution is also adapted to the pitch p between neighbouring pads, i.e. at the characteristic surface to be covered. For example, the concentration is such that it leads to a number distribution per unit surface having an average number $n_{avg}$ of 10 objects 18 per p*p.

The objects 18 are put into solution in a suitable solvent 20. The solvent 20 is characterized by an evaporation temperature. Preferably, the solvent is an organic solvent such as propanol or N-methyl-pyrrolidone (designated as NMP) or di-methyl-formaldehyde (designated as DMF).

In step 130, the solution is sprayed on the upper face 12 of the substrate 10. This step is known per se.

This step provides the use of a spraying machine 25. Such a machine is known. For example it is described in document FR 2 966 062 A1.

Droplets of the solution are deposited in a substantially uniform way on the upper face 12 of the substrate 10 heated to a temperature above the evaporation temperature of the solvent.

In this way, the solvent instantaneously evaporates in contact with the substrate 10 so as to avoid the formation of deposits of the "coffee drops" type, having a non-uniform distribution wherein the nanomaterials are concentrated on circles.

After a deposition time, the solvent 20 is evaporated and the objects 18 lie on the face 12.

Subsequently to this spraying step, the obtained circuit 30 is a completely random network, each node of which is formed by a pad 14 and each link, by at least one object 18. The circuit 30 forms a practical embodiment of what is called in the literature dense and disordered interconnection networks. Such networks have exclusively been studied theoretically and statistically, for example in the article of C. Teuscher et al., IEEE Proceedings of the ACM International Symposium on Nanoscale Architecture p. 16 (2008).

The stochastic characteristics of the circuit 30 depend on the pattern formed by the pads 14, on the length distribution of the objects 18, and on the number distribution per unit surface of the objects 18.

Figure 2:
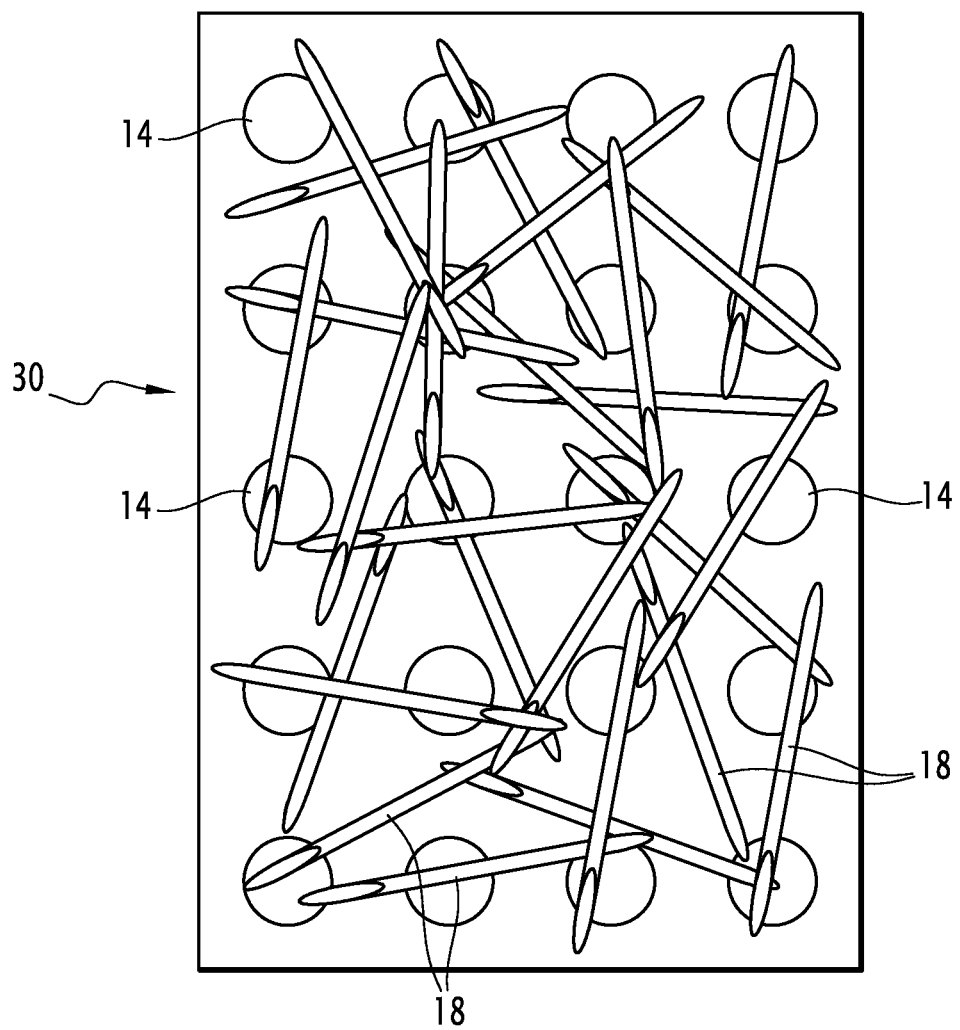

Thus, as this is illustrated in FIG. 2, some of the objects 18 are not in contact with any pad, others in contact with a single pad, finally others in contact with two or a small number of pads.

Advantageously, the possibility of percolation between the objects 18 deposited during the spraying step 130 is utilized for attaining a very high number of output pads connected to a same input pad. This therefore gives the possibility of increasing the number of interconnections between pads 14.

Thus, some of the objects 18 are not in contact with any other nanowire, others, in contact with a single nanowire, others finally with two or a small number of objects.

Two pads 14 may be interconnected by a link formed by several objects 18 in contact with each other, at least pair wise.

It should be emphasized that the obtained circuit 30 is random not only as regards the links between pads 14 but also as regards the functions of the pads which are interconnected with at least another pad. Indeed, at each instant of the method, such pads do not have a determined function: input pad, output pad or input/output pad.

The spraying step 130 may be accomplished without any constraint so that the obtained circuit 30 is totally random.

The spraying step may alternatively be carried out under constraints so as to constraint the deposition of the objects 18 along one or several preferred directions and thus orient the organization of the links of the circuit.

For example, an electric and/or magnetic field is generated in the space between the spraying nozzle of the machine 25 used and the upper face 12 of the substrate.

Further for example, an alternating voltage is applied, during the spraying step, between two pads 14. The deposited objects 18 will then tend, by dielectrophoresis to align, between both of these pads, along the direction of the lines of the electric field. It is expected that the solvent of the solution be evaporated and the operation is started again for another pair of pads.

The method continues with a step 140 for configuration of the random circuit so as to obtain a neuromimetic circuit 40.

Step 140 first consists of cleaning the random circuit 30 by using a cleaning method giving the possibility of removing the objects 18 deposited in certain areas of the face 12, for example an area between pads 14 which should operate as an input and which should not be interconnected together. Thus, the potential interferences between certain pads 14 are removed. When the unidimensional nanometric objects used are carbon nanotubes, the cleaning method consists in applying an "oxygen" plasma on the relevant area. Similar methods to the ones used for etching the circuit may be contemplated for nanowires/nanotubes.

Step 140 then consists of activating a pad by injecting therein a current while applying to the other pads of the circuit 30 a readout voltage. In this way, it is possible to determine the pads interconnected with each other.

The step 140 finally consists in applying at least one stimulus between two pads 14 actually interconnected so as to modify the value of the characteristic quantity of the object 18.

When this quantity is a resistance, the stimulus is a configuration voltage for the link between the relevant pads. The value of this configuration voltage is selected depending on the value of the electric resistance which one wishes to give the link, i.e. to the object(s) making up this link. In other words, the electric resistance of the object(s) between both relevant pads is modified by using electric signals, the voltage of which is selected in a range of values allowing a change of state of the object.

Each link between two pads 14 is thus configured so that it behaves like a synapse between two neurones.

At the end of step 140, the neuromimetic circuit 40 obtained is ready to be used for example in a system for cognitive processing of information.

The use of the neuromimetic circuit 40 for example consists of applying read out voltages between the pads 14. The value of a read out voltage is selected from a range of values of less than the range of values of the voltages for the configuration of the links of the network. Other uses may also be contemplated, in particular so as to modify the electric resistance of a link depending on the use of this link.

One skilled in the art will observe that the application of the method shown above is particularly easy. It only includes a small number of technological steps.

This method is of the «bottom-up» type allows easy making of the neuromimetic circuits having a large interconnection density. This comes from the fact that that there is a coincidence between a synapse between neurones and an electrical link, produced by one or several unidimensional nanometric objects between two pads forming a node.

This method gives the possibility of obtaining low cost neuromimetic circuits.

The invention claimed is:

1. A neuromimetic circuit, the neuromimetic circuit including a random network, said random network including:
    nodes, each node being formed with a pad forming an electric contact borne on a face of a substrate, each node being formed with the pad arranged on the face of the substrate according to a grid pattern, the nodes being positioned at an intersection of lines and columns of the grid pattern;
    links between nodes, each link being formed with at least one unidimensional nanometric object with variable and non-volatile resistance having a resistance configured subsequently to the application of a suitable stimulus between at least one pair of pads connected through said link; and
    wherein each unidimensional nanometric object with variable and non-volatile resistance is with a phase transition.

2. The circuit according to claim 1, wherein each unidimensional nanometric object with a variable and non-volatile resistance is a nanowire or a nanotube.

\* \* \* \* \*